(12) United States Patent
Kawaguchi et al.

(10) Patent No.: US 10,243,516 B2
(45) Date of Patent: Mar. 26, 2019

(54) AUDIO AMPLIFIER AND AUDIO POWER AMPLIFIER

(71) Applicant: ONKYO CORPORATION, Osaka (JP)

(72) Inventors: Tsuyoshi Kawaguchi, Osaka (JP); Norimasa Kitagawa, Osaka (JP); Takuya Oka, Osaka (JP)

(73) Assignee: ONKYO CORPORATION, Osaka (JP)

( * ) Notice: Subject to any disclaimer, the term of this patent is extended or adjusted under 35 U.S.C. 154(b) by 0 days.

(21) Appl. No.: 15/888,031

(22) Filed: Feb. 4, 2018

(65) Prior Publication Data

US 2018/0241348 A1 Aug. 23, 2018

(30) Foreign Application Priority Data

Feb. 20, 2017 (JP) ................................. 2017-029215

(51) Int. Cl.
*H03F 1/02* (2006.01)
*H03F 1/30* (2006.01)
(Continued)

(52) U.S. Cl.
CPC ............. *H03F 1/0205* (2013.01); *H03F 1/30* (2013.01); *H03F 1/34* (2013.01); *H03F 3/181* (2013.01);
(Continued)

(58) Field of Classification Search
None
See application file for complete search history.

(56) References Cited

U.S. PATENT DOCUMENTS 3,416,092 A * 12/1968 Frederiksen .............. H03F 1/34
330/260
3,693,106 A * 9/1972 Long ....................... H03F 3/213
330/265
(Continued)

FOREIGN PATENT DOCUMENTS

| EP | 2 424 106 A | 2/2012 |
| JP | 2012-249206 A | 12/2011 |
| JP | 2012-109932 A | 6/2012 |

OTHER PUBLICATIONS

Extended European Search Report for corresponding App. No. 18155543.4-1203, dated Jun. 21, 2018.

*Primary Examiner* — Patricia T Nguyen
(74) *Attorney, Agent, or Firm* — Renner Otto Boisselle & Sklar, LLP (57) ABSTRACT

A first circuit unit of an audio amplifier includes a first emitter follower connected to an pre stage input terminal, a second emitter follower connected to an pre stage input terminal, a main transistor connected to an output path of the first emitter follower and an output path of the second emitter follower, a first resistor and a second resistor, which are series-connected between the output path of the first emitter follower and a DC voltage source, and a zener diode connected to a series-connection point between the first resistor and the second resistor. A second circuit unit has a circuit configuration that is complementary to the first circuit unit. A path leading to a collector of each transistor configuring the first and second emitter followers in one of the circuit units is connected to the series-connection point in the other circuit unit.

4 Claims, 4 Drawing Sheets

(51) Int. Cl.
*H03F 1/34* (2006.01)
*H03F 3/181* (2006.01)
*H03F 3/26* (2006.01)
*H03F 3/50* (2006.01)
*H03F 3/183* (2006.01)
*H03F 3/21* (2006.01)

(52) U.S. Cl.
CPC ............... *H03F 3/183* (2013.01); *H03F 3/21* (2013.01); *H03F 3/26* (2013.01); *H03F 3/50* (2013.01); *H03F 2200/03* (2013.01); *H03F 2200/151* (2013.01); *H03F 2200/21* (2013.01); *H03F 2200/408* (2013.01); *H03F 2203/5036* (2013.01)

(56) References Cited

U.S. PATENT DOCUMENTS

| | | | | |
|---|---|---|---|---|
| 4,031,482 | A | * | 6/1977 | Tsurushima ............ H03F 1/305 330/264 |
| 4,345,215 | A | * | 8/1982 | Amada ..................... H03F 1/02 330/264 |
| 4,864,249 | A | * | 9/1989 | Reiffin .................. H03F 3/3076 330/263 |
| 8,310,307 | B2 | | 11/2012 | Kawaguchi |
| 2011/0000707 | A1 | | 1/2011 | Kawai |
| 2011/0084764 | A1 | * | 4/2011 | Salomie .................. H03F 3/187 330/260 |
| 2012/0049895 | A1 | | 3/2012 | Kawaguchi |

\* cited by examiner

AUDIO AMPLIFIER AND AUDIO POWER AMPLIFIER

BACKGROUND OF THE INVENTION

1. Field of the Invention

The present invention relates to an audio amplifier and an audio power amplifier, and particularly relates to the stabilization of a bias voltage or bias current.

2. Description of the Related Art

An audio amplifier that amplifies an acoustic signal is widely used. A bias voltage or bias current (hereinafter collectively referred to as a bias) is provided to each transistor included in the audio amplifier, and determines the state of each transistor of when an acoustic signal is not inputted into the audio amplifier. The operating state is represented by, for example, a bias current flowing through the base, collector, or emitter, or a bias voltage between these terminals. When an acoustic signal is inputted into the audio amplifier, the voltage and current of each terminal of each transistor changes depending on the acoustic signal with reference to the operating state of when an acoustic signal is not inputted. The audio amplifier outputs a voltage or current of a predetermined terminal as an amplified acoustic signal.

Audio amplifiers are described in JP-A-2012-109932 and JP-A-2012-249206. In the audio amplifiers described in these patent documents, bias voltages between the bases and the emitters of amplifier transistors TR5 and TR6 are stabilized by base-emitter voltages of emitter follower transistors TR1 to TR4 provided to a pair of input terminals, and bias setting transistors TR7 and TR8. Moreover, circuits are used in which currents flowing through the collectors of the amplifier transistors TR5 and TR6 are not restricted by a constant current power supply for bias setting. Accordingly, a distortion included in the amplified signal is suppressed.

The audio amplifiers described in these patent documents are DC amplifiers that amplify a signal in a frequency band ranging from frequency zero to an audio frequency. In the DC amplifier, an pre stage amplifier circuit amplifies not only an alternating current component but also a DC component of a signal, and outputs the signal to a post stage power amplifier circuit. The power amplifier circuit amplifies the DC component outputted from the pre stage amplifier circuit. Therefore, a bias of a transistor included in the pre stage amplifier circuit becomes unstable. If a DC offset voltage is generated, the power amplifier circuit results in amplifying and outputting the DC offset voltage. The audio amplifiers described in these patent documents employ a circuit that stabilizes the bias of each transistor. However, the bias may become unstable due to, for example, the fluctuation of the output voltage of a DC voltage source.

SUMMARY OF THE INVENTION

An object of the present invention is to stabilize a bias voltage or bias current in an audio amplifier.

The present invention provides an audio amplifier including a first circuit unit and a second circuit unit that are complementary to each other, each of the first and second circuit units includes: a first emitter follower connected to a first input terminal of the audio amplifier; a second emitter follower connected to a second input terminal of the audio amplifier; a main transistor of which a base is connected to an output path of the first emitter follower, of which an emitter is connected to an output path of the second emitter follower, and of which a collector outputs a signal; a first and a second resistor series-connected between the output path of the first emitter follower and a DC voltage source; and a constant voltage generator connected to a series-connection point between the first and second resistors, a path leading to a collector of each transistor configuring the first and second emitter followers in the first circuit unit is connected to the series-connection point in the second circuit unit, a path leading to a collector of each transistor configuring the first and second emitter followers in the second circuit unit is connected to the series-connection point in the first circuit unit, and the output path of the first emitter follower in the first circuit unit and the output path of the first emitter follower in the second circuit unit are provided with a bias setting circuit for the first and second circuit units.

Preferably, each of the first and second circuit units includes: an auxiliary transistor of which an emitter is connected to a path leading to an emitter of the transistor included in the first emitter follower and of which a collector is connected to a path leading to the base of the main transistor; and a third resistor connected between the collector and a base of the auxiliary transistor, the audio amplifier further includes a fourth resistor between the base of the auxiliary transistor included in the first circuit unit and the base of the auxiliary transistor included in the second circuit unit, and the fourth resistor, and the auxiliary transistors and the third resistors in the first and second circuit units configure the bias setting circuit.

Preferably, each of the first and second circuit units includes: an auxiliary transistor of which an emitter is connected to a path leading to an emitter of the transistor included in the first emitter follower and of which a base and collector are connected to a path leading to the base of the main transistor; and a bias resistor on the path leading to the emitter of the transistor included in the first emitter follower, and the auxiliary transistors and the bias resistors configure the bias setting circuit.

Preferably, included are the audio amplifier; and an amplifier circuit connected to each path extended from the collectors of the main transistors of the first and second circuit units, to which power from the DC voltage source is supplied.

According to the present invention, a bias voltage or bias current in the audio amplifier can be stabilized.

Figure 1:
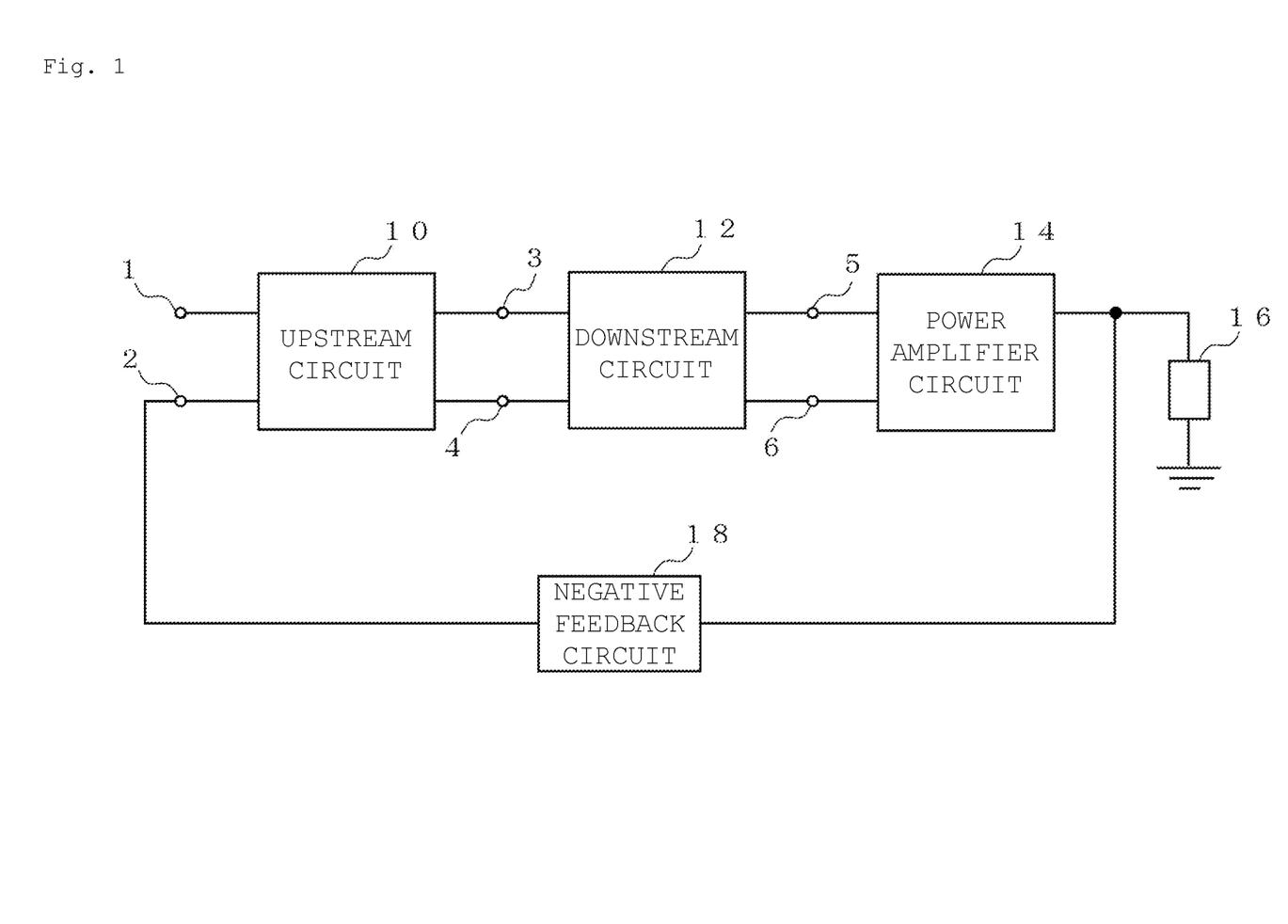
FIG. 1 is a diagram illustrating the configuration of an audio power amplifier according to an embodiment of the present invention.

DETAILED DESCRIPTION OF THE PREFERRED EMBODIMENTS (1) Overview of Configuration and Operation of DC Audio Power Amplifier FIG. 1 illustrates the configuration of a DC audio power amplifier according to an embodiment of the present invention. The DC audio power amplifier includes an pre stage circuit 10, a post stage circuit 12, a power amplifier circuit 14, and a negative feedback circuit 18. A speaker 16 is connected as a load to the power amplifier circuit 14. The DC audio power amplifier amplifies a signal in a frequency band ranging from frequency zero to an audio frequency.

The pre stage circuit 10 reverses the phase of an acoustic signal inputted from an pre stage input terminal 1 and amplifies the acoustic signal to output it to post stage input terminals 3 and 4. Moreover, the pre stage circuit 10 amplifiers an acoustic signal inputted from an pre stage input terminal 2 in the same phase to output it to the post stage input terminals 3 and 4.

The post stage circuit 12 reverses the phase of the acoustic signal inputted from the post stage input terminal 3 and amplifies the acoustic signal to output it to a power amplifier input terminal 5. Moreover, the post stage circuit 12 reverses the phase of the acoustic signal inputted from the post stage input terminal 4 and amplifies the acoustic signal to output it to a power amplifier input terminal 6.

The power amplifier circuit 14 passes a current flowing out from the power amplifier circuit 14 to the speaker 16 when the voltage of the acoustic signal inputted into the power amplifier input terminal 5 is positive, and passes a current flowing from the speaker 16 into the power amplifier circuit 14 when the voltage of the acoustic signal inputted into the power amplifier input terminal 6 is negative.

If the power amplifier circuit 14 is an amplifier circuit that operates in Class A or AB mode, the power amplifier circuit 14 passes the current flowing out from the power amplifier circuit 14 to the speaker 16 also when the voltage of the acoustic signal inputted into the power amplifier input terminal 6 is positive, and passes the current flowing from the speaker 16 into the power amplifier circuit 14 also when the voltage of the acoustic signal inputted into the power amplifier input terminal 5 is negative.

With such a configuration, the acoustic signal in the same phase as the acoustic signal inputted into the pre stage input terminal 1 is outputted from the power amplifier circuit 14 to the speaker 16, and the acoustic signal in the opposite phase to the acoustic signal inputted into the pre stage input terminal 2 is outputted from the power amplifier circuit 14 to the speaker 16.

The negative feedback circuit 18 is connected between the speaker 16 and the pre stage input terminal 2. The negative feedback circuit 18 divides the voltage that is outputted to the speaker 16 at a predetermined ratio, and outputs it to the pre stage input terminal 2. Consequently, a part of the voltage that is outputted to the speaker 16 is fed back to the pre stage circuit 10 in the opposite phase. If a gain from the pre stage input terminal 1 to the speaker 16 is sufficiently large in a case where such a negative feedback circuit 18 is not provided, a gain at the time when the negative feedback circuit 18 is provided is determined by a ratio to negatively feedback the voltage that is outputted to the speaker 16.

When an acoustic signal is inputted into the pre stage input terminal 1, the pre stage circuit 10, the post stage circuit 12, and the power amplifier circuit 14 amplify the acoustic signal at the gain determined by the negative feedback circuit 18 to output the acoustic signal to the speaker 16.

(2) Configuration of Pre Stage Circuit

Figure 2:
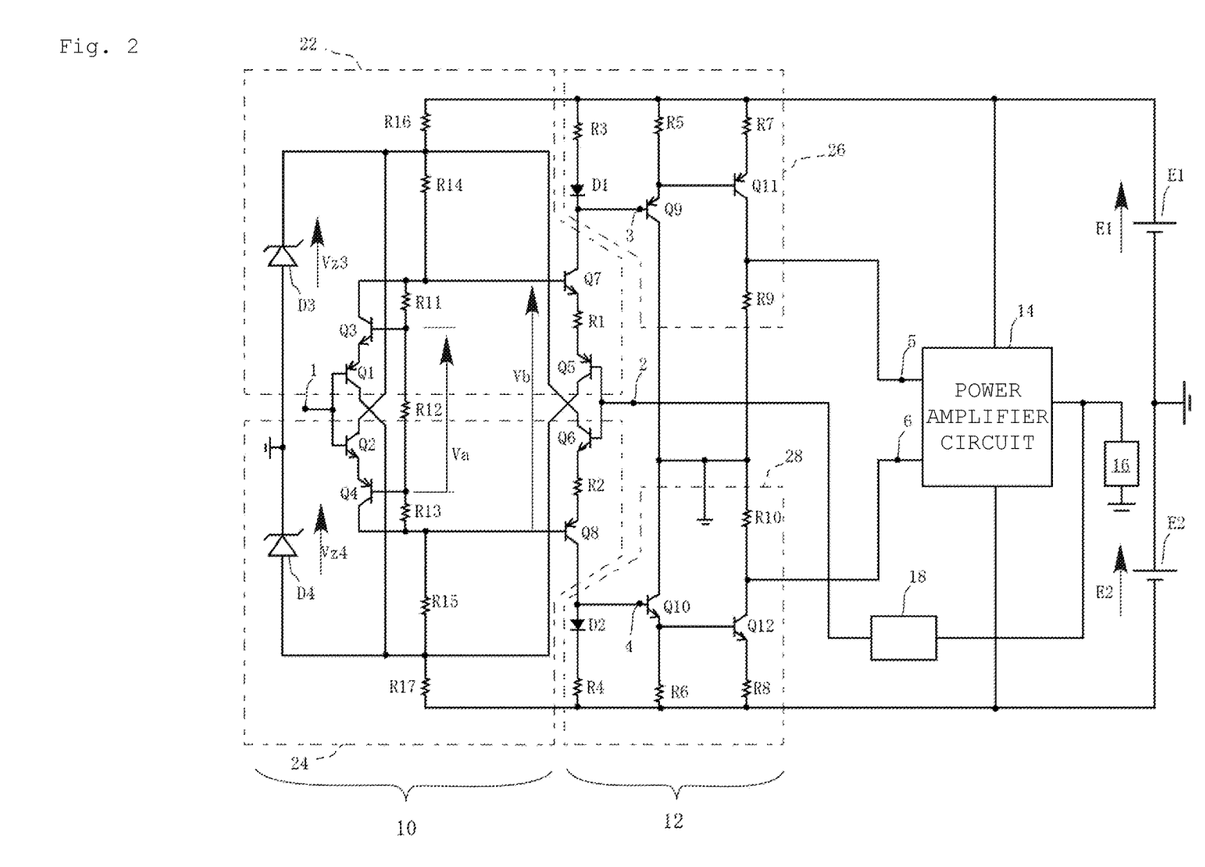
FIG. 2 is a diagram illustrating specific configurations of an pre stage circuit and a post stage circuit.

FIG. 2 illustrates specific configurations of the pre stage circuit 10 and the post stage circuit 12. The pre stage circuit 10 includes a first circuit unit 22 and a second circuit unit 24, which are complementary to each other. That the two circuits are complementary to each other indicates a relationship where bias voltages appearing at structurally symmetrical positions are of the same value and of opposite polarities, and bias currents flowing through structurally symmetrical paths are of the same value and in opposite directions. A potential at each node where the two complementary circuits are connected is ideally zero. In order to achieve circuit configurations that are complementary to each other, semiconductor elements that are complementary to each other, and resistors (resistive elements) of the same resistance value are used in the first circuit unit 22 and the second circuit unit 24.

The first circuit unit 22 includes transistors Q1, Q3, Q5, and Q7, resistors R1, R11, R14, and R16, and a zener diode D3. The second circuit unit 24 includes transistors Q2, Q4, Q6, and Q8, resistors R2, R13, R15, and R17, and a zener diode D4. The transistors Q1, Q4, Q5, and Q8 are of the PNP type, and the transistors Q2, Q3, Q6, and Q7 are of the NPN type.

The circuit configuration of the first circuit unit 22 is described. The base of the transistor Q1 is connected to the pre stage input terminal 1. The emitter of the transistor Q1 is connected to the emitter of the transistor Q3. The collector of the transistor Q3 is connected to the base of the transistor Q7. The resistor R11 is connected between the collector and the base of the transistor Q3.

The base of the transistor Q5 is connected to the pre stage input terminal 2. The emitter of the transistor Q5 is connected to one end of the resistor R1. The emitter of the transistor Q7 is connected to the other end of the resistor R1. The collector of the transistor Q7 is connected to the cathode of a bias diode D1 of a third circuit unit 26 described below. A resistor R3 of the third circuit unit 26 described below is connected between the anode of the bias diode D1 and the positive terminal of a DC voltage source E1.

The negative terminal of the DC voltage source E1 is connected to a ground conductor. The series-connected resistors R16 and R14 are connected between the positive terminal of the DC voltage source E1 and the base of the transistor Q7. A series-connection point between the resistors R16 and R14 is connected to the cathode of the zener diode D3. The anode of the zener diode D3 is connected to a ground conductor.

The circuit configuration of the second circuit unit 24 is described. The base of the transistor Q2 is connected to the pre stage input terminal 1. The emitter of the transistor Q2 is connected to the emitter of the transistor Q4. The collector of the transistor Q4 is connected to the base of the transistor Q8. The resistor R13 is connected between the collector and the base of the transistor Q4.

The base of the transistor Q6 is connected to the pre stage input terminal 2. The emitter of the transistor Q6 is connected to one end of the resistor R2. The other end of the resistor R2 is connected to the emitter of the transistor Q8. The collector of the transistor Q8 is connected to the anode of a bias diode D2 of a fourth circuit unit 28 described below. A resistor R4 of the fourth circuit unit 28 described below is connected between the cathode of the bias diode D2 and the negative terminal of a DC voltage source E2.

The positive terminal of the DC voltage source E2 is connected to the ground conductor. The series-connected resistors R17 and R15 are connected between the negative terminal of the DC voltage source E2 and the base of the transistor Q8. A series-connection point between the resistors R17 and R15 is connected to the anode of the zener diode D4. The cathode of the zener diode D4 is connected to the ground conductor.

A connection between the first circuit unit 22 and the second circuit unit 24 is described. A resistor R12 is connected between the base of the transistor Q3 included in the first circuit unit 22 and the base of the transistor Q4 included in the second circuit unit 24. The collectors of the transistors Q1 and Q5 included in the first circuit unit 22 are connected to the anode of the zener diode D4 included in the second circuit unit 24. The collectors of the transistors Q2 and Q6 included in the second circuit unit 24 are connected to the cathode of the zener diode D3 included in the first circuit unit 22.

If the complementarity of the first circuit unit 22 and the second circuit unit 24 is perfect, DC offset voltages appearing at the pre stage input terminals 1 and 2 are zero. However, in reality, electrical characteristics of the circuit elements vary. Accordingly, the DC offset voltages have values that are not zero in many cases. Hence, the resistance values of the resistors in the mutually complemental relationship, such as the pair of the resistors R1 and R2 and the pair of the resistors R11 and R13 in the first circuit unit 22 and the second circuit unit 24, may be made different to adjust the complementarity and bring the DC offset voltage close to zero, or cause the DC offset voltage to agree with zero.

(3) Bias of Each Transistor Included in Pre Stage Circuit

The bias of each transistor included in the pre stage circuit 10 is described. In the following description, a reference numeral assigned to each resistor is assumed to represent a resistance value thereof. The bias of each transistor is determined under conditions such as that the first circuit unit 22 and the second circuit unit 24 are complementary to each other, that a base-emitter voltage of each transistor has a general value, and that voltages between the terminals appearing at the zener diodes D3 and D4 are constant. A collector current, an emitter current, and a base current are described here as the bias of each transistor. Moreover, the base-emitter voltage may also be referred to as the emitter-base voltage in the case of the PNP transistor. However, the expressions are unified here as the base-emitter voltage to simplify the expression.

Firstly, the base-emitter voltage of each of the transistors Q1 to Q4 is focused on. A voltage Va between the base of the transistor Q3 and the base of the transistor Q4 is assumed to be the sum of the base-emitter voltages of the transistors Q3, Q1, Q2, and Q4. In other words, the sum of the voltage of the emitter of the transistor Q4 with reference to the base, the voltage of the base of the transistor Q2 with reference to the emitter, the voltage of the emitter of the transistor Q1 with reference to the base, and the voltage of the base of the transistor Q3 with reference to the emitter is the voltage Va.

A base-emitter voltage Vbe of a transistor is generally 0.6 V to 0.7 V, and a change thereof is small. Consequently, a current of Ia=Va/R12=4·Vbe/R12 flows through the resistor R12. In other words, the current Ia flowing through the resistor R12 is determined in accordance with (Math. 1).

$$Ia = 4 \cdot Vbe/R12 \qquad \text{(Math. 1)}$$

Currents flowing through the bases of the transistors Q3 and Q4 are minute. Accordingly, the current of substantially the same value as the current Ia flowing through the resistor R12 flows through the resistors R11 and R13. Therefore, a voltage drop at a series-connected portion of the resistors R11, R12, and R13 is determined, and a voltage Vb between the base of the transistor Q7 and the base of the transistor Q8 is determined. In other words, the voltage Vb is determined in accordance with (Math. 2).

$$Vb = (R11 + R12 + R13) \cdot Ia \qquad \text{(Math. 2)}$$
$$= 4 \cdot Vbe \cdot (R11 + R12 + R13)/R12$$

In this manner, the transistors Q1 to Q4 and the resistors R11, R12, and R13 configure a voltage regulator circuit that stabilizes the voltage Vb between the base of the transistor Q7 and the base of the transistor Q8.

Next, the base-emitter voltage of each of the transistors Q5 to Q8 is focused on. The base-emitter voltage of each of the transistors Q7, Q5, Q6, and Q8 is also 0.6 V to 0.7 V, and a change thereof is small. Furthermore, if the first circuit unit 22 and the second circuit unit 24 are complementary to each other, and the potential of the pre stage input terminal 2 (a voltage with reference to a ground conductor) is zero, voltages Vr applied to the resistors R1 and R2 are equal, and Vr=Vb/2−2·Vbe. In other words, the voltages Vr applied to the resistors R1 and R2 are determined in accordance with (Math. 3).

$$Vr = Vb/2 - 2 \cdot Vbe \qquad \text{(Math. 3)}$$

Here, the voltage Vb is of a value determined in accordance with (Math. 2). The resistance values of the resistors R1 and R2 are equal. Accordingly, the currents flowing through them are equal, and Vr/R1=Vr/R2. The currents are equal to emitter currents Ie of the transistors Q5 to Q8.

Therefore, the emitter currents Ie of the transistors Q5 to Q8 are determined in accordance with (Math. 4).

$$Ie = (Vb/2 - 2 \cdot Vbe)/R1 = (Vb/2 - 2 \cdot Vbe)/R2 \qquad \text{(Math. 4)}$$

Collector currents Ic of the transistors Q5 to Q8 are substantially equal to the emitter currents Ie thereof. In other words, it can be considered as Ic=Ie.

Next, the collector currents and the emitter currents of the transistors Q1 to Q4 are described, focusing on the voltages between the terminals appearing at the zener diodes D3 and D4. The positive terminal of the DC voltage source E1 applies a reverse bias voltage to the zener diode D3 via the resistor R16. The diode D3 functions as a constant voltage generator, a constant voltage Vz3 appears between the terminals with the cathode side as positive. The negative terminal of the DC voltage source E2 applies a reverse bias voltage to the zener diode D4 via the resistor R17. The diode D4 functions as a constant voltage generator, and a constant voltage Vz4 appears between the terminals with the anode side as negative.

The first circuit unit 22 and the second circuit unit 24 are complementary to each other. Accordingly, the potential of the base of the transistor Q7, that is, the potential of the collector of the transistor Q3 is Vb/2. The potential of the cathode of the zener diode D3 is Vz3. Accordingly, a current I14 flowing through the resistor R14 connected between the cathode of the zener diode D3 and the collector of the transistor Q3 is determined in accordance with (Math. 5).

$$I14 = (Vz3 - Vb/2)/R14 \qquad \text{(Math. 5)}$$

The current flowing through the resistor R14 is diverted to the collector of the transistor Q3 and the resistor R11. Hence, a collector current Ic3 of the transistor Q3 has a value obtained by subtracting the above current Ia from the current I14 as presented in (Math. 6).

$$Ic3 = I14 - Ia \qquad \text{(Math. 6)}$$

The emitter currents of the transistors Q3 and Q1 and the collector current of the transistor Q1 are substantially equal to the collector current Ic3 of the transistor Q3. Therefore, it can be considered that the collector currents and the emitter currents of the transistors Q1 and Q3 are determined in accordance with (Math. 6).

The first circuit unit 22 and the second circuit unit 24 are complementary to each other. Accordingly, a collector current Ic4 of the transistor Q4 is determined on a similar principle to the collector current Ic3. In other words, a current I15 flowing through the resistor R15 is determined in accordance with (Math. 7), and the collector current Ic4 is determined in accordance with (Math. 8).

$$I15=(Vz4-Vb/2)/R15 \qquad \text{(Math. 7)}$$

$$Ic4=I15-Ia \qquad \text{(Math. 8)}$$

Moreover, it can be considered that the collector currents and the emitter currents of the transistors Q2 and Q4 are determined in accordance with (Math. 8).

The base current of each of the transistors Q1 to Q8 has a value obtained by dividing the collector current thereof by a current amplification factor hfe specific to the transistor.

In this manner, the biases of the transistors Q1 to Q8 are determined by the base-emitter voltages Vbe (=0.6 V to 0.7 V) thereof and the voltages between the terminals appearing at the zener diodes D3 and D4 under the condition that the first circuit unit 22 and the second circuit unit 24 are complementary to each other. Therefore, the biases of the transistors Q1 to Q8 are hardly influenced by fluctuations in the output voltages of the DC voltage sources E1 and E2.

The potentials of the collectors of the transistors Q7 and Q8 fluctuate according to fluctuations in the output voltages of the DC voltage sources E1 and E2. However, the fluctuations in the collector potentials have a small influence on the DC offset voltages appearing at the pre stage input terminals 1 and 2. This is because even if the collector potentials of the transistors Q7 and Q8 fluctuate, the biases of the transistors Q1 to Q8 are determined by the base-emitter voltages Vbe of the transistors and the voltages between the terminals appearing at the zener diodes D3 and D4.

(4) Amplification Operation of Pre Stage Circuit

The amplification operation of the first circuit unit 22 is described. The transistor Q1 configures an emitter follower where the collector is AC-grounded. It can be considered that the transistor Q3 is AC short-circuited between the collector and the emitter as described below. It can be said that the emitter of the transistor Q1 is connected to the resistor R14 and the transistor Q7. Here, being AC-grounded or short-circuited indicates that even if the current fluctuates according to the acoustic signal, the potential or the voltage between the terminals does not fluctuate.

The acoustic signal inputted from the pre stage input terminal 1 into the base of the transistor Q1 is outputted from the emitter of the transistor Q1 to the resistor R14 and the base of the transistor Q7. A connection point between the resistor R14 and the zener diode D3 is AC-grounded. The acoustic signal is transmitted to the base of the transistor Q7 in accordance with the voltage generated at the resistor R14.

The bias diode D1 connected to the collector of the transistor Q7 is in a forward biased state. Accordingly, it can be considered that the bias diode D1 is AC short-circuited, and it can be said that the collector of the transistor Q7 is connected to the resistor R3 and the base of a transistor Q9.

The transistor Q7 outputs the amplified acoustic signal to the resistor R3 and the base of the transistor Q9 in accordance with the acoustic signal inputted from the base. In other words, a connection point between the resistor R3 and the DC voltage source E1 is AC-grounded. The acoustic signal is transmitted to the base of the transistor Q9 in accordance with the voltage generated at the resistor R3.

The transistor Q5 configures an emitter follower where the collector is AC-grounded as in the transistor Q1. The emitter of the transistor Q5 is connected to the emitter of the transistor Q7 via the resistor R1. The transistor Q5 configures the emitter follower. Accordingly, the impedance on the transistor Q5 side is small when viewed from the resistor R1. Therefore, the transistor Q7 configures a common emitter amplifier circuit where the resistor R1 is inserted between the emitter and a ground conductor with reference to the emitter follower configured by the transistor Q1. Hence, the acoustic signal inputted into the pre stage input terminal 1 and then transmitted by the emitter follower is amplified by the common emitter amplifier circuit after a phase thereof is reversed. The acoustic signal is transmitted to the base of the transistor Q9.

The acoustic signal inputted from the pre stage input terminal 2 into the base of the transistor Q5 is outputted to the emitter of the transistor Q7 via the resistor R1. The transistor Q7 outputs the amplified acoustic signal to the resistor R3 and the base of the transistor Q9 in accordance with the acoustic signal inputted from the emitter. The acoustic signal is transmitted to the base of the transistor Q9 in accordance with the voltage generated at the resistor R3.

The transistor Q1 configures the emitter follower. Accordingly, the impedance on the transistor Q1 side is small when viewed from the transistor Q7. Therefore, the transistor Q7 configures a common base amplifier circuit with reference to the emitter follower configured by the transistor Q5. Hence, the acoustic signal inputted into the pre stage input terminal 2 and then transmitted by the emitter follower is amplified in the same phase by the common base amplifier circuit. The acoustic signal is transmitted to the base of the transistor Q9.

Next, the amplification operation of the second circuit unit 24 is described. The second circuit unit 24 is complementary to the first circuit unit 22. Hence, the second circuit unit 24 performs a similar amplification operation to that of the first circuit unit 22 on the acoustic signals inputted into the pre stage input terminals 1 and 2, and outputs the amplified acoustic signal to the base of a transistor Q10.

The acoustic signal inputted from the pre stage input terminal 1 into the base of the transistor Q2 is outputted from the emitter of the transistor Q2 to the resistor R15 and the base of the transistor Q8. The acoustic signal is transmitted to the base of the transistor Q8 in accordance with the voltage generated at the resistor R15. The acoustic signal inputted from the pre stage input terminal 2 into the base of the transistor Q6 is outputted to the emitter of the transistor Q8 via the resistor R2.

The transistor Q8 outputs the acoustic signal to the resistor R4 and the transistor Q10 in accordance with the acoustic signals transmitted by the emitter followers and then inputted into the base and emitter. The acoustic signal is transmitted to the base of the transistor Q10 in accordance with the voltage generated at the resistor R4.

The transistor Q8 configures a common emitter amplifier circuit with reference to the emitter follower configured by the transistor Q2. Accordingly, the acoustic signal inputted into the pre stage input terminal 1 and then transmitted by the emitter follower is amplified after a phase thereof is reversed. The acoustic signal is transmitted to the base of the transistor Q10.

Moreover, the transistor Q8 configures a common base amplifier circuit with reference to the emitter follower configured by the transistor Q6. Accordingly, the acoustic signal inputted into the pre stage input terminal 2 is amplified in the same phase. The acoustic signal is transmitted to the base of the transistor Q10.

In this manner, the transistors Q1 and Q2 configure the emitter followers for increasing the input impedance of the pre stage input terminal 1. The transistors Q5 and Q6 configure the emitter followers for increasing the input impedance of the pre stage input terminal 2. The transistors Q7 and the Q8 serve as main transistors that amplify the acoustic signal inputted from the pre stage input terminal 1 after reversing the phase thereof, and amplify the acoustic signal inputted from the pre stage input terminal 2 in the same phase.

The transistors Q3 and Q4 are auxiliary transistors for bias setting, and can be considered to be AC short-circuited between the collectors and the emitters. The transistors Q1 and Q2 output the acoustic signals of the same amplitude and the same phase to the emitters of the transistors Q3 and Q4 in accordance with the acoustic signal inputted from the pre stage input terminal 1. The bases of the transistors Q3 and Q4 are connected by the resistor R12. However, the acoustic signals at the emitters of the transistors Q3 and Q4 are of the same amplitude and the same phase. Accordingly, a voltage based on the acoustic signal does not appear at both ends of the resistor R12. Therefore, voltages that change depending on the acoustic signal do not appear between the bases and the emitters and between the collectors and the emitters of the transistors Q3 and Q4. Accordingly, the transistors Q3 and Q4 are short-circuited between the collectors and the emitters in terms of the acoustic signal, that is, AC short-circuited.

In this manner, the output path of the emitter follower configured by the transistor Q1 and the output path of the emitter follower configured by the transistor Q2 are provided with a bias setting circuit of which influence on the acoustic signal is small. The bias setting circuit includes the transistor Q3, the resistor R11, the resistor R12, the resistor R13, and the transistor Q4, and configures the above-mentioned voltage regulator circuit together with the transistors Q1 and Q2.

(5) Configuration of Post Stage Circuit

The post stage circuit 12 includes the third circuit unit 26 and the fourth circuit unit 28, which are complementary to each other. The third circuit unit 26 includes the transistor Q9 and a transistor Q11, the resistor R3, resistors R5, R7, and R9, and the bias diode D1. The fourth circuit unit 28 includes the transistor Q10, a transistor Q12, the resistor R4, resistors R6, R8, and R10, and the bias diode D2. The transistors Q9 and Q11 are of the PNP type, and the transistors Q10 and Q12 are of the NPN type. A specific configuration of the post stage circuit 12 is not limited to the circuit configuration illustrated.

The circuit configuration of the third circuit unit 26 is described. The base of the transistor Q9 serves as the post stage input terminal 3. The base of the transistor Q9 is connected to the collector of the transistor Q7 included in the first circuit unit 22. The resistor R5 is connected between the emitter of the transistor Q9 and the positive terminal of the DC voltage source E1. The collector of the transistor Q9 is connected to a ground conductor. The base of the transistor Q11 is connected to the emitter of the transistor Q9. The resistor R7 is connected between the emitter of the transistor Q11 and the positive terminal of the DC voltage source E1. The resistor R9 is connected between the collector of the transistor Q11 and the ground conductor.

The circuit configuration of the fourth circuit unit 28 is described. The base of the transistor Q10 serves as the post stage input terminal 4. The base of the transistor Q10 is connected to the collector of the transistor Q8 included in the second circuit unit 24. The resistor R6 is connected between the emitter of the transistor Q10 and the negative terminal of the DC voltage source E2. The collector of the transistor Q10 is connected to the ground conductor. The base of the transistor Q12 is connected to the emitter of the transistor Q10. The resistor R8 is connected between the emitter of the transistor Q12 and the negative terminal of the DC voltage source E2. The resistor R10 is connected between the collector of the transistor Q12 and the ground conductor.

In the third circuit unit 26 and the fourth circuit unit 28, the output voltage of the DC voltage source E1, the output voltage of the DC voltage source E2, the base-emitter voltages of the transistors Q9 to Q12, and the forward voltages of the diodes D1 and D2 have predetermined values. Hence, the bias of each transistor included in the third circuit unit 26 and the fourth circuit unit 28, together with the bias of each transistor included in the first circuit unit 22 and the second circuit unit 24, is determined.

(6) Amplification Operation of Post Stage Circuit

The amplification operation of the third circuit unit 26 is described. The transistor Q9 passes a current in accordance with the acoustic signal inputted into the base, through the resistor R5. The acoustic signal is transmitted to the base of the transistor Q11 in accordance with the voltage appearing at the resistor R5.

The transistor Q11 passes a current in accordance with the acoustic signal transmitted to the base, through the resistors R7 and R9. The acoustic signal is outputted from the third circuit unit 26 in accordance with the voltage appearing at the resistor R9.

The transistor Q9 configures an emitter follower. The transistor Q11 configures a common emitter amplifier circuit where the resistor R7 is connected between the emitter and the DC voltage source E1 (the ground conductor in terms of the acoustic signal). Therefore, the third circuit unit 26 is one where the emitter follower and the common emitter amplifier circuit are cascade-connected. The acoustic signal inputted into the post stage input terminal 3 is amplified after the phase thereof is reversed, and then outputted from the third circuit unit 26.

The fourth circuit unit 28 is complementary to the third circuit unit 26. Hence, the fourth circuit unit 28 performs a similar amplification operation to that of the third circuit unit 26. The amplified acoustic signal is outputted from the fourth circuit unit 28. In other words, the transistor Q10 configures an emitter follower. The transistor Q12 configures a common emitter amplifier circuit where the resistor R8 is connected between the emitter and the ground conductor in terms of the acoustic signal. Therefore, the fourth circuit unit 28 is one where the emitter follower and the common emitter amplifier circuit are cascade-connected. The acoustic signal inputted into the post stage input terminal 4 is amplified after the phase thereof is reversed, and then outputted from the fourth circuit unit 28.

(7) Power Amplifier Circuit

The DC voltage sources E1 and E2 supply source power to the power amplifier circuit 14. The acoustic signal outputted from the third circuit unit 26 is inputted into the power amplifier input terminal 5. The acoustic signal outputted from the fourth circuit unit 28 is inputted into the power amplifier input terminal 6. The power amplifier circuit 14 passes a current through the speaker 16 in accordance with the acoustic signal inputted into each power amplifier input terminal.

As described above, the acoustic signal inputted from the pre stage input terminal 1 is outputted in the same phase to the speaker 16. The acoustic signal inputted from the pre stage input terminal 2 is outputted in the opposite phase to the speaker 16. The negative feedback circuit 18 is connected between the speaker 16 and the pre stage input terminal 2. A part of the voltage that is outputted to the speaker 16 is negatively fed back to the pre stage circuit 10 by the phase relationship between the signal that is inputted into the pre stage input terminal 2 and the signal that is outputted to the speaker 16.

(8) Effect

A regulated power supply circuit is not generally used for the DC voltage source in an audio power amplifier. In other words, an alternating current voltage from a commercial power supply is reduced by a transformer, rectified by a diode, and smoothed by a capacitor without using a regulator IC is used as a DC voltage source in many cases.

If a regulated power supply circuit is not used in the DC audio power amplifier illustrated in FIG. 2, a large current flows through the DC voltage sources E1 and E2; accordingly, the output voltages of the DC voltage sources E1 and E2 may decrease.

As described above, in the DC audio power amplifier according to the embodiment, fluctuations in the bias currents, the base potentials, and the emitter potentials of the transistors Q1 to Q8 caused by fluctuations in the output voltages of the DC voltage sources E1 and E2 are small. Consequently, the fluctuations of the DC offset voltages appearing at the pre stage input terminals 1 and 2 are reduced, which in turn also leads to a reduction in the fluctuation of the DC offset voltage amplified by the post stage circuit 12 and the power amplifier circuit 14 and then outputted from the power amplifier circuit 14. The DC amplifier amplifies a signal in a frequency band ranging from frequency zero to an audio frequency. Accordingly, the DC offset voltage generated in the pre stage amplifier circuit results in being amplified by the post stage amplifier circuit and outputted to the speaker. According to the embodiment, the pre stage circuit 10 reduces the fluctuation of the DC offset voltage to reduce the fluctuation of the DC offset voltage appearing post stage.

(9) Experimental Results

Figure 3:
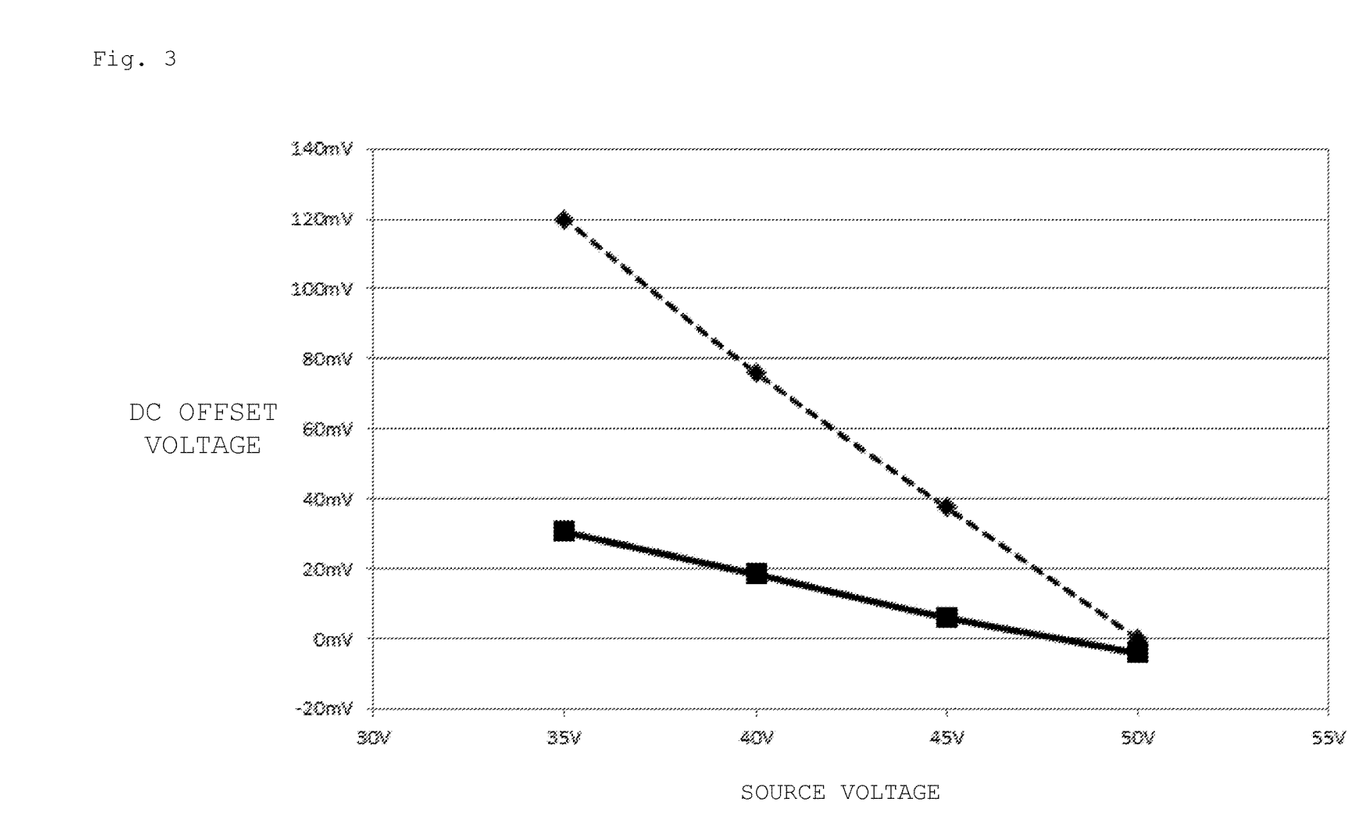
FIG. 3 is a diagram illustrating experimental results.

FIG. 3 illustrates a relationship between the output voltages of the DC voltage sources E1 and E2 and the DC offset voltage appearing at an output terminal connected to the speaker. The output voltages of the DC voltage sources E1 and E2 are assumed to be equal. The horizontal axis indicates the output voltages of the DC voltage sources E1 and E2. The vertical axis indicates the DC offset voltage appearing at the output terminal. Measurement points linked by a broken line indicate experimental results of a DC audio power amplifier which uses the technology described in JP-A-2012-249206. Measurement points linked by a solid line indicate experimental results of the DC audio power amplifier according to the embodiment.

(10) Modification of Bias Setting Circuit

Figure 4:
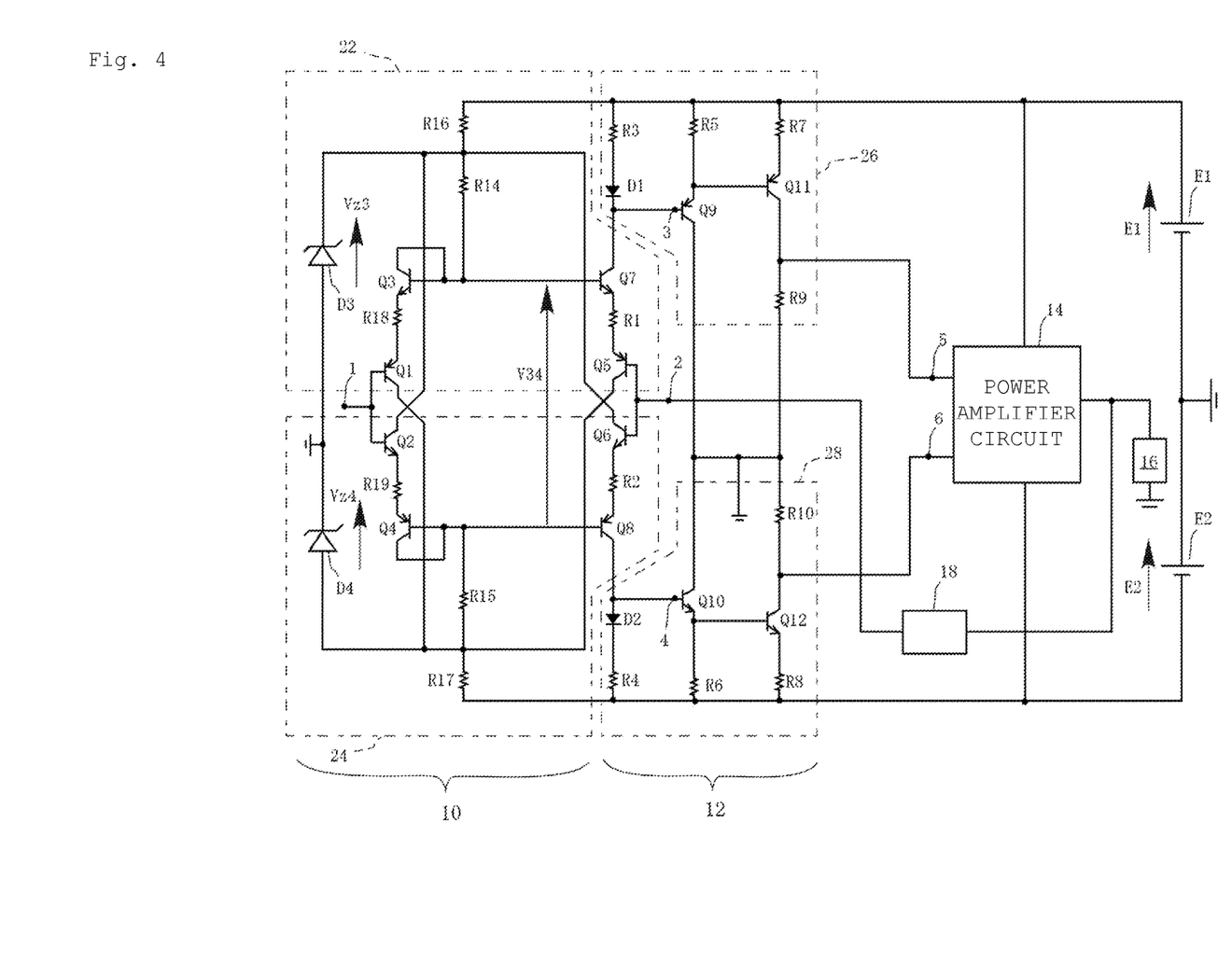
FIG. 4 is a diagram illustrating a modification of the DC audio power amplifier.

FIG. 4 illustrates a modification of the DC audio power amplifier. This DC audio power amplifier is a modification of the bias setting circuit configured of the transistor Q3, the resistors R11, R12, and R13, and the transistor Q4 in FIG. 2.

A bias resistor R18 is connected between the emitter of the transistor Q1 and the emitter of the transistor Q3. The collector of the transistor Q3 is connected to the base thereof. The base of the transistor Q3 is connected to the base of the transistor Q7 and one end of the resistor R14.

Similarly, a bias resistor R19 is connected between the emitter of the transistor Q2 and the emitter of the transistor Q4. The collector of the transistor Q4 is connected to the base thereof. The base of the transistor Q4 is connected to the base of the transistor Q8 and one end of the resistor R15.

A voltage V34 between the base of the transistor Q3 and the base of the transistor Q4 is determined as follows: in other words, letting that the potential of the pre stage input terminal 1 be zero, a voltage being the sum of the base-emitter voltage of the transistor Q1, the voltage between the terminals of the bias resistor R18, the base-emitter voltage of the transistor Q3, and the voltage between the terminals of the resistor R14 is equal to the voltage Vz3 between the terminals of the zener diode D3. Therefore, the following (Math. 9) holds true. This is solved for I14 to obtain (Math. 10).

$$Vz3 = (R14+R18) \cdot I14 + 2 \cdot Vbe \qquad \text{(Math. 9)}$$

$$I14 = (Vz3 - 2 \cdot Vbe)/(R14+R18) \qquad \text{(Math. 10)}$$

In other words, the resistance values of the resistors R14 and R18 are determined to determine the collector currents and the emitter currents of the transistors Q1 and Q3 in accordance with (Math. 10).

Moreover, the base potential of the transistor Q3 is obtained by subtracting R14's inter-terminal voltage R14·I14 from the voltage Vz3 between the terminals of the zener diode D3. Therefore, a base potential Vb3 of the transistor Q3 is determined in accordance with (Math. 11).

$$\begin{aligned} Vb3 &= Vz3 - R14 \cdot I14 \\ &= (R18 \cdot Vz3 + 2 \cdot R14 \cdot Vbe)/(R14+R18) \end{aligned} \qquad \text{(Math. 11)}$$

Similarly, a base potential Vb4 of the transistor Q4 is determined in accordance with (Math. 12).

$$Vb4 = -(R19 \cdot Vz4 + 2 \cdot R15 \cdot Vbe)/(R15+R19) \qquad \text{(Math. 12)}$$

The voltage V34 between the base of the transistor Q3 and the base of the transistor Q4 is obtained by subtracting (Math. 12) from (Math. 11).

$$\begin{aligned} V34 &= (R18 \cdot Vz3 + 2 \cdot R14 \cdot Vbe)/(R14+R18) + \\ &\quad (R19 \cdot Vz4 + 2 \cdot R15 \cdot Vbe)/(R15+R19) \\ &= 2 \cdot (R18 \cdot Vz3 + 2 \cdot R14 \cdot Vbe)/(R14+R18) \\ &= 2 \cdot (R19 \cdot Vz4 + 2 \cdot R15 \cdot Vbe)/(R15+R19) \end{aligned} \qquad \text{(Math. 13)}$$

Therefore, if the resistance values of the resistors R14, R18, R15, and R19 are determined, the voltage V34 between the bae of the transistor Q3 and the base of the transistor Q4 is determined. Furthermore, the collector currents and the emitter currents of the transistors Q5 to Q8 are determined in accordance with an equation where V34 is assigned to Vb of (Math. 4).

In this manner, the transistor Q3, the resistor R18, the transistors Q1 and Q2, the resistor R19, and the transistor Q4 configure a voltage regulator circuit that stabilizes the voltage V34. The temperature characteristics of the transistors Q3 and Q7, the temperature characteristics of the transistors Q1 and Q5, and the temperature characteristics of the transistors Q2 and Q6, and the temperature characteristics of the transistors Q4 and Q8 are approximated to reduce the fluctuation of the voltage V34 with respect to the temperature change.

If the fluctuation of the temperature characteristic does not matter, the transistors Q3 and Q4 may be replaced with diodes. In this case, a diode is inserted between the base of the transistor Q7 and the resistor R18, setting the base side of the transistor Q7 as the anode, and a diode is inserted between the base of the transistor Q8 and the resistor R19, setting the base side of the transistor Q8 as the cathode.

Next, the operation for the acoustic signal is described. The transistors Q3 and Q4 have a similar voltage-current characteristic to that of a forward biased diode, between the collectors and the emitters. Therefore, the transistors Q3 and Q4 may be treated as short-circuited between the collectors and the emitters in terms of the acoustic signal.

In terms of the acoustic signal, the resistor R18 is series-connected to the resistor R14 and the transistor Q7 to serve as the load of the emitter follower configured by the transistor Q1. Similarly, the resistor R19 is series-connected to the resistor R15 and the transistor Q8 to serve as the load of the emitter follower configured by the transistor Q2.

(11) Other Modifications

The example where a zener diode is used as a constant voltage generator in the pre stage circuit 10 is described above. A DC voltage source or battery may be used as the constant voltage generator instead of the zener diode. The DC voltage source may decrease an alternating current voltage from a commercial power supply with a transformer, rectify it with a diode, and further stabilize and output it with a regulator IC.

Moreover, a post stage stage of the pre stage circuit 10 is not necessarily a circuit for connecting the speaker. For example, the pre stage circuit 10 may be used as a general-purpose amplifier that amplifies an analog signal in a mobile phone or the like.

In the above description, a circuit post stage of the pre stage circuit 10 is configured of two stages, the post stage circuit 12 and the power amplifier circuit 14. Instead of such a configuration, complementary single ended push-pull amplifier circuit may be provided post stage of the pre stage circuit 10. In other words, an amplifier circuit may be provided which outputs a signal in single mode (unbalanced mode) for input signals from two terminals that input an inphase signal.

The circuit operation has been illustrated above on the condition that the first circuit unit 22 and the second circuit unit 24 are complementary to each other. In each embodiment, the values of resistors in the mutually complementary relationship, such as the pair of the resistors R1 and R2 and the pair of the resistors R11 and R13 in the first circuit unit 22 and the second circuit unit 24, may be made different to adjust the complementarity and adjust the DC offset voltage.

What is claimed is:

1. An audio amplifier comprising a first circuit unit and a second circuit unit that are complementary to each other, wherein
    each of the first and second circuit units includes:
        a first emitter follower connected to a first input terminal of the audio amplifier;
        a second emitter follower connected to a second input terminal of the audio amplifier;
        a main transistor of which a base is connected to an output path of the first emitter follower, of which an emitter is connected to an output path of the second emitter follower, and of which a collector outputs a signal;
        a first resistor and a second resistor series-connected between the output path of the first emitter follower and a DC voltage source; and
        a constant voltage generator connected to a series-connection point between the first and second resistors,
    a path leading to a collector of each transistor configuring the first and second emitter followers in the first circuit unit is connected to the series-connection point in the second circuit unit,
    a path leading to a collector of each transistor configuring the first and second emitter followers in the second circuit unit is connected to the series-connection point in the first circuit unit, and
    the output path of the first emitter follower in the first circuit unit and the output path of the first emitter follower in the second circuit unit are provided with a bias setting circuit for the first and second circuit units.

2. The audio amplifier according to claim 1, wherein
    each of the first and second circuit units includes:
        an auxiliary transistor of which an emitter is connected to a path leading to an emitter of the transistor included in the first emitter follower and of which a collector is connected to a path leading to the base of the main transistor; and
        a third resistor connected between the collector and a base of the auxiliary transistor,
    the audio amplifier further comprises a fourth resistor between the base of the auxiliary transistor included in the first circuit unit and the base of the auxiliary transistor included in the second circuit unit, and
    the fourth resistor, and the auxiliary transistors and the third resistors in the first and second circuit units configure the bias setting circuit.

3. The audio amplifier according to claim 1, wherein
    each of the first and second circuit units includes:
        an auxiliary transistor of which an emitter is connected to a path leading to an emitter of the transistor included in the first emitter follower and of which a base and a collector are connected to a path leading to the base of the main transistor; and
        a bias resistor on the path leading to the emitter of the transistor included in the first emitter follower, and
    the auxiliary transistors and the bias resistors configure the bias setting circuit.

4. An audio power amplifier comprising:
    the audio amplifier according to claim 1; and
    an amplifier circuit connected to each path extended from the collectors of the main transistors of the first and second circuit units, to which power from the DC voltage source is supplied.

* * * * *